(12) United States Patent
Li

(10) Patent No.: US 7,705,467 B2
(45) Date of Patent: Apr. 27, 2010

(54) STACKED PACKAGE ELECTRONIC DEVICE

(75) Inventor: Delin Li, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 275 days.

(21) Appl. No.: 11/769,536

(22) Filed: Jun. 27, 2007

(65) Prior Publication Data

US 2007/0278645 A1 Dec. 6, 2007

Related U.S. Application Data

(62) Division of application No. 10/880,998, filed on Jun. 30, 2004, now Pat. No. 7,245,003.

(51) Int. Cl.
H01L 23/34 (2006.01)

(52) U.S. Cl. .................. 257/777; 257/778; 257/780; 257/784; 257/E25.027; 257/E23.085

(58) Field of Classification Search ............. 257/777, 257/685, 686, 723, E25.005, E25.006, E25.021, 257/E25.027, E23.085
See application file for complete search history.

(56) References Cited

U.S. PATENT DOCUMENTS

| 6,005,778 | A | 12/1999 | Spielberger et al. |
|---|---|---|---|
| 6,191,360 | B1 | 2/2001 | Tao et al. |
| 6,437,446 | B1 | 8/2002 | Uchida |
| 6,555,902 | B2 | 4/2003 | Lo et al. |
| 6,555,917 | B1 * | 4/2003 | Heo ........................... 257/777 |
| 6,576,997 | B2 | 6/2003 | Uchida |
| 6,593,662 | B1 * | 7/2003 | Pu et al. ..................... 257/777 |
| 6,650,009 | B2 | 11/2003 | Her et al. |
| 6,740,970 | B2 | 5/2004 | Hiraoka et al. |
| 6,781,849 | B2 | 8/2004 | Baek et al. |
| 6,787,893 | B2 | 9/2004 | Nakajima et al. |
| 6,906,424 | B2 | 6/2005 | Kinsman |
| 6,919,631 | B1 | 7/2005 | Hoffman et al. |
| 6,933,597 | B1 | 8/2005 | Poddar et al. |
| 6,949,835 | B2 | 9/2005 | Konishi et al. |
| 6,952,047 | B2 | 10/2005 | Li |
| 7,023,079 | B2 | 4/2006 | Wang et al. |
| 7,023,096 | B2 | 4/2006 | Lee et al. |
| 7,095,105 | B2 | 8/2006 | Cherukuri et al. |
| 2006/0003494 | A1 | 1/2006 | Li |

* cited by examiner

Primary Examiner—Jasmine J Clark
(74) Attorney, Agent, or Firm—Schwegman, Lundberg & Woessner, P.A.

(57) ABSTRACT

An electrical component includes a substrate, a first integrated circuit attached to the substrate, a metal portion coupled to the first integrated circuit, and a second integrated circuit attached to the first integrated circuit. The metal portion is sandwiched between the first integrated circuit and the second integrated circuit.

5 Claims, 4 Drawing Sheets

STACKED PACKAGE ELECTRONIC DEVICE

RELATED APPLICATION

This application is a divisional of U.S. Application Ser. No. 10/880,998 filed Jun. 30, 2004, now issued as U.S. Pat. No. 7,245,003, which is incorporated herein by reference.

FIELD OF THE INVENTION

The present invention is related to formation of structures associated with semiconductor devices. More specifically, the present invention relates to methods and apparatus for forming a stacked package electronic device.

BACKGROUND OF THE INVENTION

Integrated circuits have been manufactured for many years. Manufacturing integrated circuits involves integrating various active and passive circuit elements into a piece of semiconductor material, referred to as a die. The die is then mounted into a ceramic or plastic substrate to form a package. In some applications, these packages are directly attached to a printed circuit board by connecting pins, which are arranged along the periphery or area array of the package. An electronic system can be formed by connecting various integrated circuit packages to a printed circuit board.

As advances in semiconductor manufacturing technology have led to substantially increased numbers of transistors on each integrated circuit, it has become possible to correspondingly increase the functionality of each integrated circuit. In turn, increased functionality has resulted in the need to increase the number of input/output (I/O) connections between the integrated circuit and the rest of the electronic system of which the integrated circuit is a part. One adaptation designed to address the increased need for I/O connections has been to simply add additional pins to the package. Unfortunately, adding pins to the package increases the area consumed by the package.

A further adaptation designed to address the increased need for I/O connections without consuming an unacceptably large amount of area was the development of ball grid array (BGA) packages. A typical example of the BGA packages include a plurality of solder bumps formed by a process commonly referred to as controlled collapsed chip connection (C4). In such a package, a large number of I/O connection terminals are disposed in a two dimensional array over a substantial portion of a major surface of the package. In some instances, BGA packages are directly attached to a supporting substrate such as a printed circuit board.

There is an ever-present trend in the electronics industry toward miniaturization, enhancement of functionality, and increased memory capacity of consumer and computing products. This trend continuously pressures the microelectronics industry. One response to the industry trend has been to make multi-die packaging to provide enhanced functionality, increased memory capacity, and miniaturized consumer and computing products. Many vendors in the semiconductor industry offer a multi-chip, System-on-Chip (SoC), or stacked packaging solution. in an attempt to provide enhanced functionality, increased memory capacity, and miniaturized consumer and computing products. One example of the stacked packages is the combination of a flip chip BGA and Plastic Ball Grid Array (PBGA). The flip chip BGA device has an active surface near the input/output balls while the PBGA device has an active surface more distant from the input/output balls.

An issue related to stacked packages including at least two electronic devices is electromagnetic interference (EMI). EMI is any electromagnetic disturbance that interrupts, obstructs or otherwise degrades or limits the effective performance of electronics or electrical equipment. In the instance of a set of stacked electronic devices, one or both of the electronic devices can operate at a frequency that produces EMI in the other of the electronic devices. EMI induced in one of the stacked electronic devices reduces the effective performance of the entire package.

BRIEF DESCRIPTION OF THE DRAWINGS

The invention is pointed out with particularity in the appended claims. However, a more complete understanding of the present invention may be derived by referring to the detailed description when considered in connection with the figures, wherein like reference numbers refer to similar items throughout the figures, and:

The description set out herein illustrates the various embodiments of the invention, and such description is not intended to be construed as limiting in any manner.

DETAILED DESCRIPTION

In the following detailed description of the preferred embodiments, reference is made to the accompanying drawings that form a part hereof, and in which are shown by way of illustration specific embodiments in which the invention can be practiced. The embodiments illustrated are described in sufficient detail to enable those skilled in the art to practice the teachings disclosed herein. Other embodiments can be utilized and derived therefrom, such that structural and logical substitutions and changes can be made without departing from the scope of present inventions. The following detailed description, therefore, is not to be taken in a limiting sense, and the scope of various embodiments of the invention is defined only by the appended claims, along with the full range of equivalents to which such claims are entitled.

Figure 1:
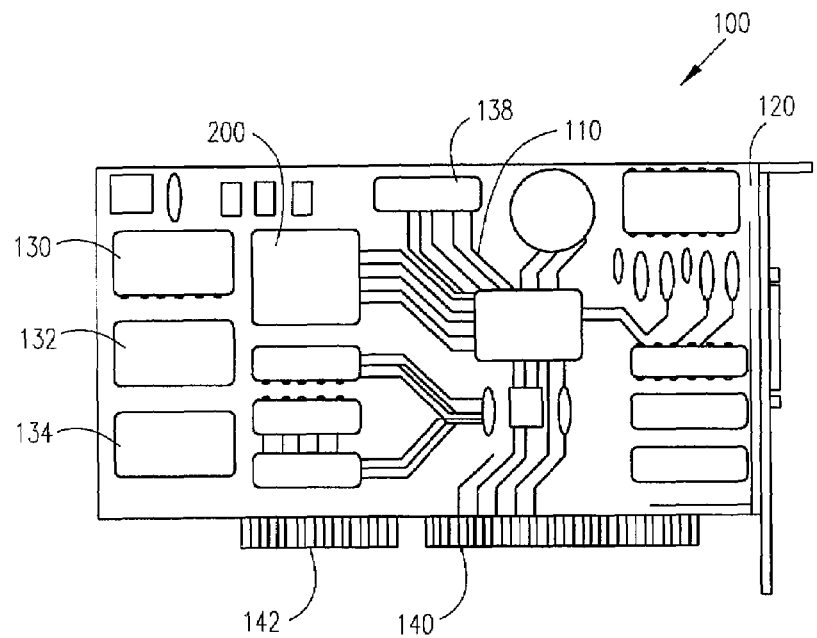
FIG. 1 is a top view of a printed circuit board having a package with at least two stacked integrated circuits, wherein the package is attached to the printed circuit board.

FIG. 1 is a top view of a printed circuit board 100. The printed circuit board 100 includes an electrical device or component 200 formed according to an embodiment of the invention. The printed circuit board ("PCB") 100 is a multi-layer plastic board that includes patterns of printed circuits on one or more layers of insulated material. The printed circuit board 100 also includes conductors or electrical traces 110. The patterns of conductors or electrical traces 110 correspond to the wiring of an electronic circuit formed on one or more of the layers of the printed circuit board 100. Some of the electrical traces 110 can be found on an exterior surface 120 of the printed circuit board 100, and also can be found on the various layers within the printed circuit board 100. Printed circuit boards also include through holes (not shown in FIG. 1) which are used to interconnect traces on various layers of the printed circuit board 100. The printed circuit board 100 can also include planes of metallized materials such as ground planes, power planes, or voltage reference planes (not shown in FIG. 1).

The printed circuit board 100 is also populated with various components 130, 132, 134, 138, 200. The components 130, 132, 134, 138, 200 can be either discrete components or semiconductor chips which include thousands of transistors. The components 130, 132, 134, 138, 200 can use any number of technologies to connect to the exterior surface 120 of the printed circuit board 100. For example, pins may be inserted into plated through holes, or pins may extend through the printed circuit board 100. An alternative technology is surface mount technology, where an electrical component, such as component 200, mounts to an array of pads on the exterior surface 120 of the printed circuit board 100. For example, component 200 could be a ball grid array package or device that has an array of balls or bumps that interact or are connected to a corresponding array of pads on the exterior surface 120 of the printed circuit board 100.

The printed circuit board 100 can also include traces 110 for making external connections to other electrical or electronic devices. In one embodiment of the invention, the component 200 is a central processing chip or microprocessor that can be used as a controller or for any other function. Although the printed circuit board 100 shown is a daughter board, the printed circuit board 100 could also be a motherboard, and the component or electrical device could be the main processing unit for a computer. In some computing environments, multiple main processing units can be used.

As shown in FIG. 1, the printed circuit board 100 includes a first edge connector 140 and a second edge connector 142. There are external traces, such as electrical trace 110, on the external surface 120 of the printed circuit board 100, that connect to certain of the outputs associated with the first edge connector 140. Other traces that connect with the edge connectors 140, 142 will have traces internal to the printed circuit board 100.

Figure 2:
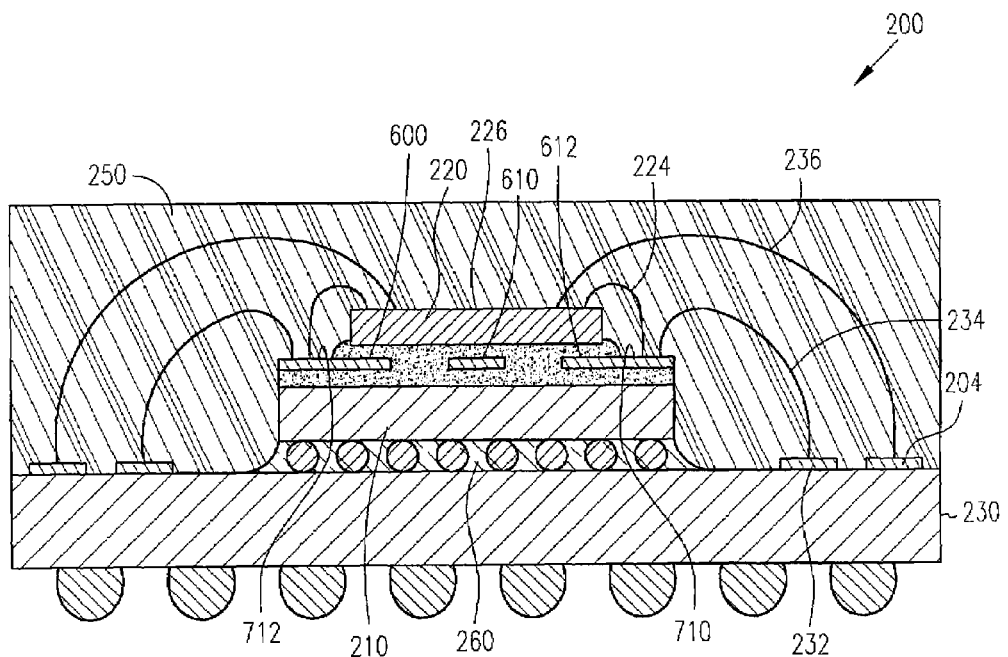
FIG. 2 illustrates a schematic side view of an encapsulated package.

FIG. 2 illustrates a schematic side view of an encapsulated package or component 200, according to an embodiment of this invention. The electrical device or component 200 includes a metal portion 600 positioned between a first integrated circuit 210, and a second integrated circuit 220. An integrated circuit generally is also commonly referred to as a die. In the embodiment shown, the metal portion 600 is sandwiched between a first integrated circuit 210, and a second integrated circuit 220. The metal portion 600, the first integrated circuit 210, and the second integrated circuit 220 are in stacked relation. The first integrated circuit 210 is attached to a substrate 230. An underfill material 260 is positioned between the first integrated circuit 210 and the substrate 230. In another embodiment, the substrate 230 is an interposer.

The metal portion 600 includes at least one opening 610 sufficiently large to allow an adhesive material 400 to pass through, but sufficiently small to substantially inhibit electromagnetic transmissions between the first integrated circuit 210 and the second integrated circuit 220. In another embodiment, the metal portion 600 includes a plurality of openings 610, 612 therein. The plurality of openings 610, 612 are sufficiently large to allow an adhesive material 400 to pass through but sufficiently small to substantially inhibit electromagnetic transmissions between the first integrated circuit 210 and the second integrated circuit 220. The adhesive material 400 attaches the first integrated circuit 210, the second integrated circuit 220 and the metal portion 600. The plurality of openings 610, 612 are positioned within the metal portion 600 so as to leave an amount of the metal portion 600 to substantially inhibit electromagnetic transmissions between the first integrated circuit 210 and the second integrated circuit 220. In one embodiment of the invention, the metal portion 600 is foil, and in another embodiment of the invention, the metal portion 600 is a plate.

The electrical component 200 also includes a ground pad 232, and a coupling 234 between the ground pad 232 and the metal portion 600, and a coupling 224 between the metal portion 600 and the second integrated circuit 220. As shown in FIG. 2, the couplings 234, 224 are conductors such as wires. The second integrated circuit 220 includes a signal input/output 226. The electrical component further includes a coupling 236 between the signal input/output 226 on the second integrated circuit 220 and a pad 204 on the substrate. The electrical component 200 also includes an encapsulating material 250. The encapsulating material, in the embodiment shown, is molded plastic. The encapsulating material 250 encapsulates the first integrated circuit 210, the second integrated circuit 220, and the metal portion 600.

In FIGS. 1 and 2, an electrical system includes a printed circuit board 100, and at least one electrical component 200 attached to the printed circuit board 100 that includes a substrate 230, a first integrated circuit 210 attached to the substrate 230, a metal portion 600 coupled to the first integrated circuit 210, and a second integrated circuit 220 coupled to the first integrated circuit 210.

FIGS. 3-10 show the elements of the encapsulated package or component 200 during various stages of fabrication. The fabrication of an encapsulated package or component 200 according to an embodiment of the invention will now be discussed.

Figure 3:
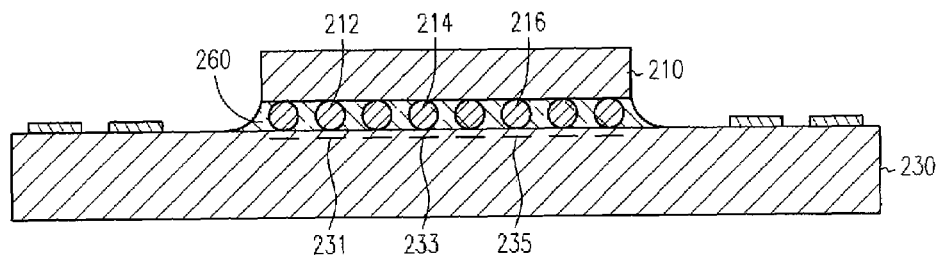
FIG. 3 illustrates a schematic side view of a package having a first integrated circuit attached to a substrate.

FIG. 3 illustrates a schematic side view of a package having a first integrated circuit 210 attached to a substrate 230, according to an embodiment of this invention. The first integrated circuit 210 includes a plurality of solder bumps, such as solder bumps 212, 214, 216. The solder bumps 212, 214, 216 are electrically coupled to corresponding pads on the substrate 231, 233, 235. After electrical connection of the first integrated circuit 210 to the substrate 230, an underfill material 260 is placed between the substrate 230 and the first integrated circuit 210. The underfill material 260 substantially fills the space between the solder bumps that remains after attaching the first integrated circuit 210 to the substrate 230. The plastic or epoxy underfill material 260 cures. The underfill material 260 prevents intrusion of other materials at the solder bumps, such as solder bumps 212, 214, 216, or in other areas between the first integrated circuit 210 and the substrate 230.

Figure 4:
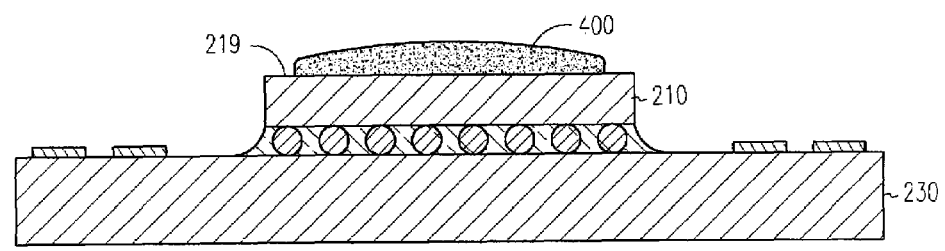
FIG. 4 illustrates a schematic side view of a first integrated circuit attached to a substrate.

FIG. 4 illustrates a schematic side view of a first integrated circuit 210 attached to a substrate 230, according to an embodiment of this invention. As shown in FIG. 4, the first integrated circuit 210 has a major surface 219. A liquid epoxy adhesive 400 is applied to the major surface 219 of the first integrated circuit 210.

Figure 5:
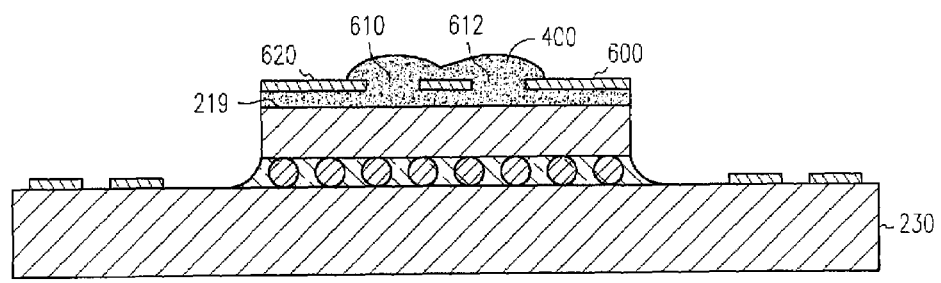
FIG. 5 illustrates a schematic side view of a first integrated circuit attached to a substrate having a metal plate attached to a major surface of the first integrated circuit.
Figure 6:
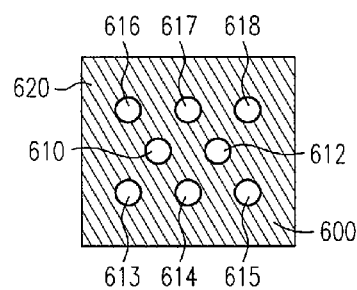
FIG. 6 illustrates a top view of metal portion adapted to be attached to the first integrated circuit.

FIG. 5 illustrates a schematic side view of the first integrated circuit 210 attached to the substrate 230 having the metal portion 600 attached to the major surface 219 of the first integrated circuit 210, according to an embodiment of the invention. While the liquid epoxy 400 is uncured, the metal portion 600 is placed into the liquid epoxy 400. The liquid epoxy 400 flows through the openings 610, 612 in the metal portion 600. The epoxy 400 is flowed through the holes to dispense the epoxy onto both sides of the metal portion 600. Essentially, the epoxy 400 is flowed through the holes to dispense the epoxy 400 on a portion of a top surface 620 of the metal portion 600. The metal portion 600, as shown in FIG. 5, is substantial enough such that wires or other connectors are bondable to the metal portion. As shown in FIG. 6, the metal portion 600 is a metal plate. In other embodiments of the invention, the metal portion 600 can also be a foil or the like.

FIG. 6 illustrates a top view of a metal portion 600 that is adapted to be attached to the first integrated circuit 210 (shown in FIGS. 2-5), according to an embodiment of the invention. The metal portion 600 is dimensioned so that it has a surface area or footprint which is substantially equal to or larger than the largest of the first integrated circuit 210 and the second integrated circuit 220. As shown in FIG. 6, the metal portion 600 has a surface area or footprint which is approximately equal to the surface area of the top surface 219 of the first integrated circuit 210 (shown in FIGS. 4 and 5). The metal portion 600 is a wire bondable metal foil or a wire bondable metal plate such as aluminum. The metal portion 600 includes a plurality of openings or holes 610, 612, 613, 614, 615, 616, 617, 618 which are positioned to allow liquid epoxy 400 (shown in FIGS. 4 and 5) to flow through the openings 610, 612, 613, 614, 615, 616, 617, 618 during the attachment of the metal portion 600 to the first integrated circuit 210. The openings 610, 612, 613, 614, 615, 616, 617, 618 are also sufficiently small and positioned on the metal portion 600 so that an electromagnetic emission from either of the first integrated circuit 210 or the second integrated circuit 220 will be shielded by the metal portion 600. In other words, the openings 610, 612, 613, 614, 615, 616, 617, 618 are situated within the metal plate or metal foil so that electromagnetic transmissions will not be transmitted to the other integrated circuit in a stack of integrated circuits 210, 220 (shown in FIG. 2). The openings 610, 612, 613, 614, 615, 616, 617, 618 are also positioned so that the flow of epoxy through the openings will allow a sufficient amount of epoxy 400 to be presented on the top surface 620 of the metal portion 600 so that the second integrated circuit 220 can be covered on one major surface 221 (shown in FIG. 7) with the epoxy 400. The openings 610, 612, 613, 614, 615, 616, 617, 618 are also positioned so that the epoxy 400 will not flow to at least a portion of the metal portion 600. Of course, the flow is also controlled by controlling the amount of liquid epoxy 400 (shown in FIGS. 4 and 5).

Figure 7:
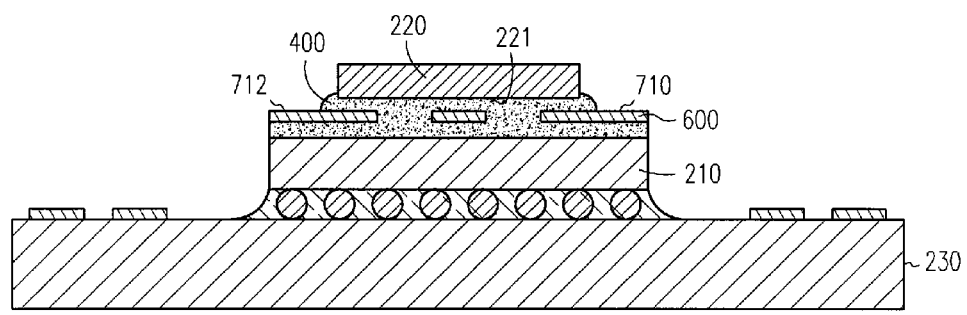
FIG. 7 illustrates a schematic side view of a metal plate sandwiched between a first integrated circuit attached to a substrate, and a second integrated circuit.

FIG. 7 illustrates a schematic side view of an assembly including a metal portion 600 sandwiched between a first integrated circuit 210 and a second integrated circuit 220, according to an embodiment of the invention. In other words, FIG. 7 illustrates a side view after the second integrated circuit 220 has been placed into the epoxy which has been flowed through the openings 610, 612, 613, 614, 615, 616, 617, 618 (shown in FIG. 6) in the metal portions. After the flow of epoxy 400, there is at least a portion of the metal portion 600 which has not been covered with the epoxy 400. As shown in FIG. 7, there are at least two portions, designated 710 and 712, that have not been covered with the epoxy 400. The epoxy 400 is then cured. The epoxy 400 can be cured in any of a number of ways, included curing by ultraviolet light.

Figure 8:
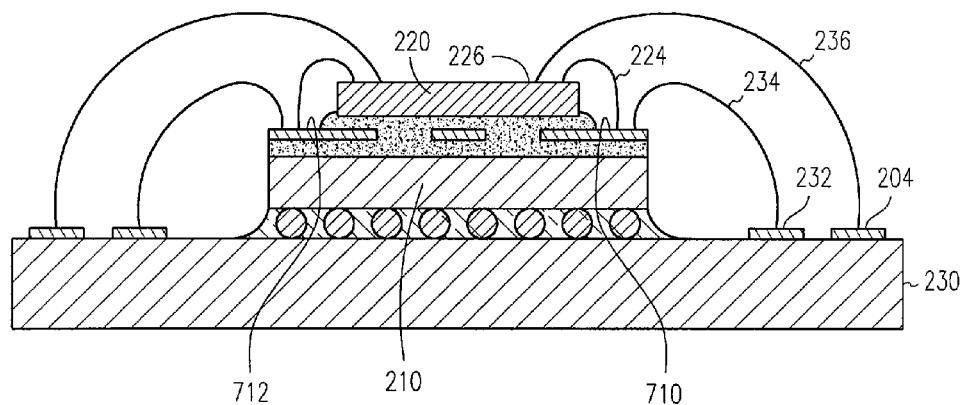
FIG. 8 illustrates a schematic side view of a package that includes a metal plate wired as a ground plane and sandwiched between a first integrated circuit attached to a substrate, and a second integrated circuit.

FIG. 8 illustrates a schematic view of the assembly shown in FIG. 7, having wires or connectors attached between the second integrated circuit 220 and the substrate 230. The portions 710, 712 of the metal portion 600, which are untouched by the epoxy, become areas where connectors can be attached to the metal portion 600. In other words, areas 710, 712 of the metal portion 600 become connection sites or bondable sites to the metal portion 600. A bond wire or connector 234 is attached between a ground pad 232 and the portion 710 of the metal portion 600. A second connector or wire 224 is connected between the portion 710 of the metal portion and a ground associated with the second integrated circuit 220. Similar connections are made to the area 712 of the metal portion 600 between another ground on the substrate and a ground on the second integrated circuit 220. Signal connectors or wires 236 are attached between bond sites for carrying signals from the second integrated circuit 220, such as bond site 226, to pads, such as pad 204, associated with the substrate 230. As shown in FIG. 8, another signal wire is also attached on the other side of the substrate 230 and on the other side of the second integrated circuit 220. Once all the electrical connections are made, the device is tested, and molded plastic 250 (see FIG. 2) is used to encapsulate the device. The end result is the device 200 shown in FIG. 2.

Figure 9:
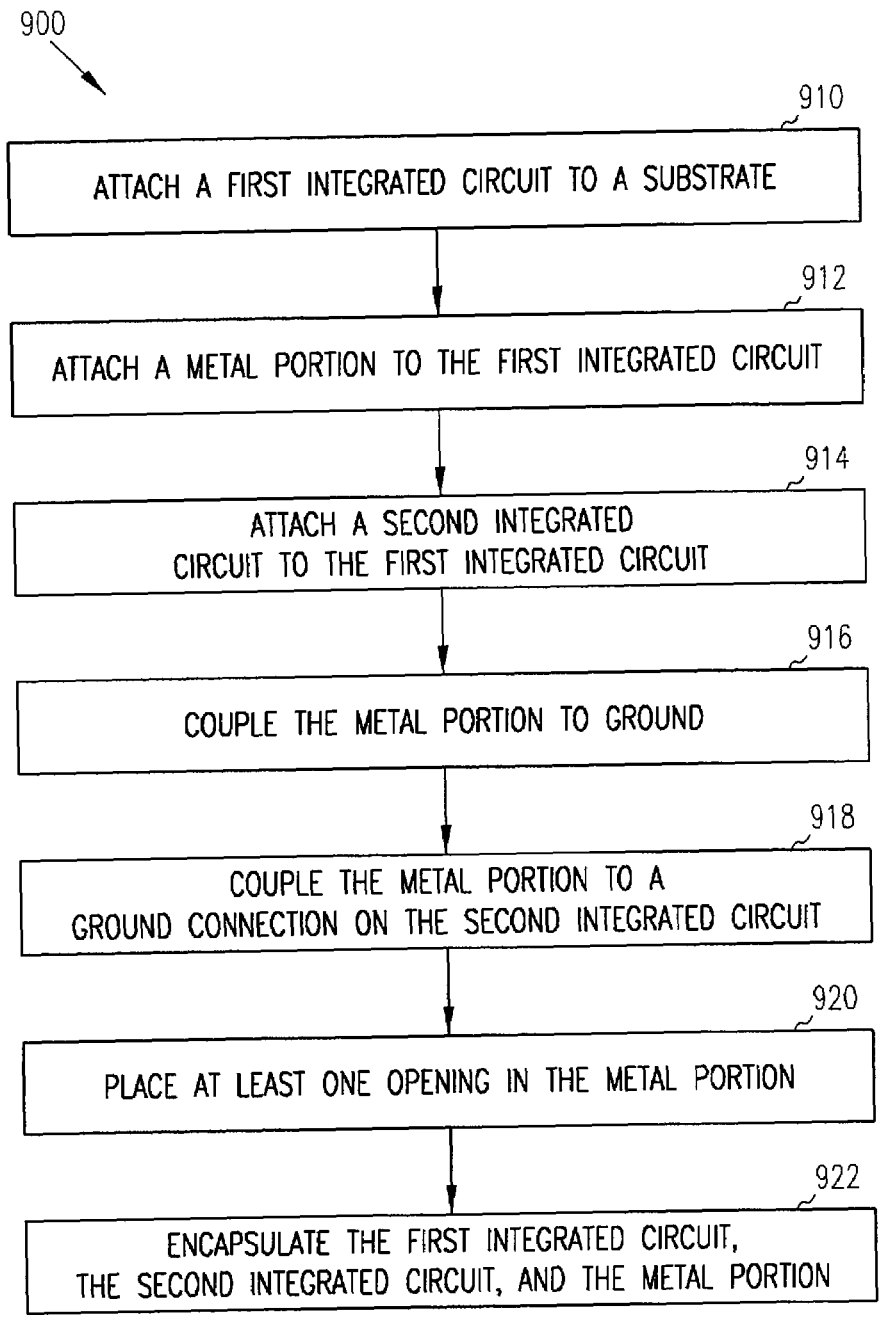
FIG. 9 illustrates a flow diagram of a method 900 for fabrication of an encapsulated device or component.

FIG. 9 illustrates a flow diagram of a method 900 for fabrication of an encapsulated device or component 200, according to an embodiment of this invention. The method 900 for forming an encapsulated device includes attaching a first integrated circuit to a substrate 910, attaching a metal portion to the first integrated circuit 912, and attaching a second integrated circuit to the first integrated circuit 914. Attaching a first integrated circuit to a substrate includes placing an underfill material between the first integrated circuit and the substrate. The method further includes coupling the metal portion to ground 916. In addition, the metal portion is coupled to a ground connection on the second integrated circuit 918. The method 900 also includes placing at least one opening in the metal portion 920. The at least one opening is sufficiently large to allow an adhesive material to pass through, but sufficiently small to substantially inhibit electromagnetic transmissions between the first integrated circuit and the second integrated circuit. The method 900 also includes encapsulating the first integrated circuit, the second integrated circuit, and the metal portion 922. In some embodiments, the method 900 includes encapsulating the first integrated circuit, the second integrated circuit, the metal portion, and the ground connections.

The foregoing description of the specific embodiments reveals the general nature of the invention sufficiently that others can, by applying current knowledge, readily modify and/or adapt it for various applications without departing from the generic concept, and therefore such adaptations and modifications are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:
1. An electrical system comprising:
a printed circuit board; and
at least one electrical component attached to the printed circuit board, the at least one component including:
a substrate;
a first integrated circuit attached to the substrate;
a metal portion coupled to the first integrated circuit; and a second integrated circuit coupled to the first integrated circuit, wherein the metal portion of the at least one electrical component is sandwiched between the first integrated circuit and the second integrated circuit;
a ground; and
a coupling between the ground and the metal portion, wherein the second integrated circuit includes a signal input/output, the electrical component further comprising a connection between the signal input/output on the second integrated circuit and a pad on the substrate.

2. The electrical system of claim 1 wherein the metal portion of the at least one electrical component is stacked between the first integrated circuit and the second integrated circuit.

3. The electrical system of claim 1 wherein the metal portion includes at least one opening sufficiently small to substantially inhibit electromagnetic transmissions between the first integrated circuit and the second integrated circuit.

4. An electrical system comprising:
a printed circuit board; and
at least one electrical component attached to the printed circuit board, the at least one component including:
a substrate;
a first integrated circuit attached to the substrate;
a metal portion coupled to the first integrated circuit; and
a second integrated circuit coupled to the first integrated circuit, wherein the metal portion of the at least one electrical component is sandwiched between the first integrated circuit and the second integrated circuit, wherein the metal portion is foil.

5. An electrical system comprising:
a printed circuit board; and
at least one electrical component attached to the printed circuit board, the at least one component including:
a substrate;
a first integrated circuit attached to the substrate;
a metal portion coupled to the first integrated circuit; and
a second integrated circuit coupled to the first integrated circuit, wherein the metal portion of the at least one electrical component is sandwiched between the first integrated circuit and the second integrated circuit, wherein the metal portion is a plate.

* * * * *